United States Patent
Liebert et al.

(10) Patent No.: US 6,762,423 B2
(45) Date of Patent: Jul. 13, 2004

(54) METHODS AND APPARATUS FOR ION BEAM NEUTRALIZATION IN MAGNETS

(75) Inventors: Reuel B. Liebert, Peabody, MA (US); Bjorn O. Pedersen, Chelmsford, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 10/287,942

(22) Filed: Nov. 5, 2002

(65) Prior Publication Data

US 2004/0084635 A1 May 6, 2004

(51) Int. Cl.[7] .......................... G21K 5/10; H01J 37/08
(52) U.S. Cl. ................................................ 250/492.21
(58) Field of Search ............................ 250/398, 492.2, 250/492.21; 313/359.1, 359

(56) References Cited

U.S. PATENT DOCUMENTS

| | | |
|---|---|---|
| 4,135,097 A | 1/1979 | Forneris et al. |
| 4,276,477 A | 6/1981 | Enge |
| 4,361,762 A | 11/1982 | Douglas |
| 4,367,411 A | 1/1983 | Hanley et al. |
| 4,463,255 A | 7/1984 | Robertson et al. |
| 4,564,758 A | 1/1986 | Slodzian et al. |
| 4,595,837 A | 6/1986 | Wu et al. |
| 4,745,281 A | 5/1988 | Enge |
| 4,786,814 A | 11/1988 | Kolondra et al. |
| 4,804,837 A | 2/1989 | Farley |
| 4,825,087 A | 4/1989 | Renau et al. |
| 4,922,106 A | 5/1990 | Berrian et al. |
| 4,939,360 A | 7/1990 | Sakai |
| 5,136,171 A * | 8/1992 | Leung et al. ............. 250/492.2 |
| 5,350,926 A * | 9/1994 | White et al. ........... 250/492.21 |
| 5,481,116 A | 1/1996 | Glavish et al. |
| 5,672,879 A | 9/1997 | Glavish |
| 5,757,018 A | 5/1998 | Mack et al. |
| 5,834,786 A * | 11/1998 | White et al. ........... 250/492.21 |
| 6,515,408 B1 * | 2/2003 | England et al. .......... 313/359.1 |
| 2002/0003208 A1 | 1/2002 | Dudnikov |
| 2003/0001110 A1 * | 1/2003 | Enge et al. ............. 250/492.21 |
| 2003/0082891 A1 * | 5/2003 | Walther ...................... 438/513 |

OTHER PUBLICATIONS

Kim et al., "Fabrication of silicon field emitters by forming porous silicon", J. Vac. Sci. Technol. B 14(3), May/Jun. 1996, pp. 1906–1909.

Kim et al., "Fabrication of metal field emitter arrays on polycrystalline silicon", J. Vac. Sci. Technol. B 15(2), Mar. Apr. 1997, pp. 468–471.

* cited by examiner

*Primary Examiner*—John R. Lee
*Assistant Examiner*—Johnnie L. Smith, II

(57) ABSTRACT

A magnet assembly is provided for use with an ion beam. The magnet assembly includes a magnet disposed in the path of the ion beam and an electron source. The magnet includes first and second polepieces spaced apart to define a magnet gap through which the ion beam is transported. The electron source is disposed on or in proximity to at least one of the polepieces for producing low energy electrons in the magnet gap. The electron source may include a one or two dimensional array of electron emitters or one or more linear electron emitters, for example. The magnet assembly may be utilized in an ion implanter to limit space charge expansion of the ion beam in the magnet gap.

26 Claims, 6 Drawing Sheets

METHODS AND APPARATUS FOR ION BEAM NEUTRALIZATION IN MAGNETS

FIELD OF THE INVENTION

This invention relates to systems and methods for ion implantation and, more particularly, to methods and apparatus for delivery of low energy ion beams to an ion implantation target, such as a semiconductor wafer. The invention improves the efficiency of low energy ion transport in the mass analysis magnet and in subsequent magnets used in different beam transport architectures.

BACKGROUND OF THE INVENTION

Ion implantation is a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam may be distributed over the target area by beam scanning, by target movement or by a combination of beam scanning and target movement.

In one prior art approach, a high current, broad beam ion implanter employs a high current density ion source, an analyzing magnet to direct a desired species through a resolving slit and an angle corrector magnet to deflect the resulting beam, while rendering the beam parallel and uniform along its width dimension. A ribbon-shaped ion beam is delivered to a target, and the target is moved perpendicular to the long dimension of the ribbon beam to distribute the ion beam over the target.

A well-known trend in the semiconductor industry is toward smaller, higher speed devices. In particular, both the lateral dimensions and the depths of features in semiconductor devices are decreasing. The implanted depth of the dopant material is determined, at least in part, by the energy of the ions implanted into the semiconductor wafer. Shallow junctions are obtained with low implant energies. However, ion implanters are typically designed for efficient operation at relatively high implant energies and may not function efficiently at the energies required for shallow junction ion implantation. At low implant energies, the current delivered to the wafer is much lower than desired and, in some cases, may be near zero. As a result, long implant times are required to achieve a specified dose, and throughput is adversely affected. Such reduction in throughput increases fabrication costs and is unacceptable to semiconductor manufacturers.

Prior art methods of increasing beam current have often involved mass analyzing and transporting the ion beam at high energies and decelerating the beam to its final low energy at a short distance from the target being implanted. This method results in a mixture of beam energies from ions which neutralize before deceleration is complete. This mixture produces a final energy contaminant at higher energy than the desired primary beam, and this contaminant is implanted at greater depth than the primary beam. Such contamination and its associated distortion of the depth distribution of implanted atoms can produce degradation of the final product or even total failure. It is desirable, therefore, to avoid the deceleration method and to transport the beam at its final intended energy after mass analysis.

Space charge effects can produce rapid divergence of the beam envelope at low energies, impeding transmission and reducing the ultimate beam current delivered to the target. Ion beams require electron clouds to maintain space charge neutralization for good transmission. However, electrons are lost to the walls of the beamline, thereby reducing space charge neutralization when electrons are not supplied to the beam.

Between the polepieces of a magnet, electrons spin around magnetic field lines as they drift through ion beams and may be captured by walls above and below the ion beam. Replacement of electrons is usually accomplished by relying on scattering of beam ions with residual gas atoms, producing ionization. As the beam energy is reduced, the ionization cross-sections are reduced and space charge effects increase. Both effects lead to beam expansion and loss of transmission. Space charge expansion is particularly problematic in magnets, because the beam path through the magnet is relatively long and electrons are not free to move across field lines.

Accordingly, there is a need for improved methods and apparatus for ion beam space charge neutralization in magnets.

SUMMARY OF THE INVENTION

According to a first aspect of the invention, an ion implanter is provided. The ion implanter comprises an ion source for generating an ion beam, at least one magnet disposed in the path of the ion beam for deflecting ions in the ion beam, the at least one magnet comprising first and second polepieces spaced apart to define a magnet gap through which the ion beam is transported, an electron source disposed on or in proximity to at least one of the polepieces for producing low energy electrons in the magnet gap, and a target site downstream of the at least one magnet for supporting a target for ion implantation, wherein the ion beam is delivered to the target site. The at least one magnet may comprise one magnet or a plurality of magnets.

In some embodiments, the ion beam comprises a ribbon ion beam having a ribbon beam width and the electron source produces low energy electrons across the ribbon beam width. In other embodiments, the ion beam is scanned so as to produce an effective scan width and the electron source produces low energy electrons across the scan width.

In various embodiments, the electron source may comprise one or more linear electron sources, a one or two-dimensional array of electron emitters, an area electron source or a combination of such sources, with the configuration selected to optimize the transport of electrons to the ion beam.

In some embodiments, the electron source comprises an array of field emitters mounted to at least one of the polepieces and facing the magnet gap. The field emitters produce low energy electrons in the magnet gap.

In some embodiments, the electron source comprises one or more electron-emitting wires disposed in proximity to at least one of the polepieces. The magnet may include a polepiece liner, and the one or more electron-emitting wires may be recessed in the polepiece liner.

According to a further aspect of the invention, a method for transporting an ion beam through a magnet comprises directing the ion beam through a magnet gap between first and second polepieces of a magnet, and supplying low energy electrons to the ion beam being transported through the magnet gap between the first and second polepieces of the magnet.

According to a further aspect of the invention, a magnet assembly is provided for operation with an ion beam. The magnet assembly comprises a magnet disposed in the path of the ion beam and one or more electron sources. The magnet includes first and second polepieces spaced apart to define a magnet gap through which the ion beam is transported. The one or more electron sources are disposed on or in proximity to at least one of the polepieces for producing low energy electrons in the magnet gap.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
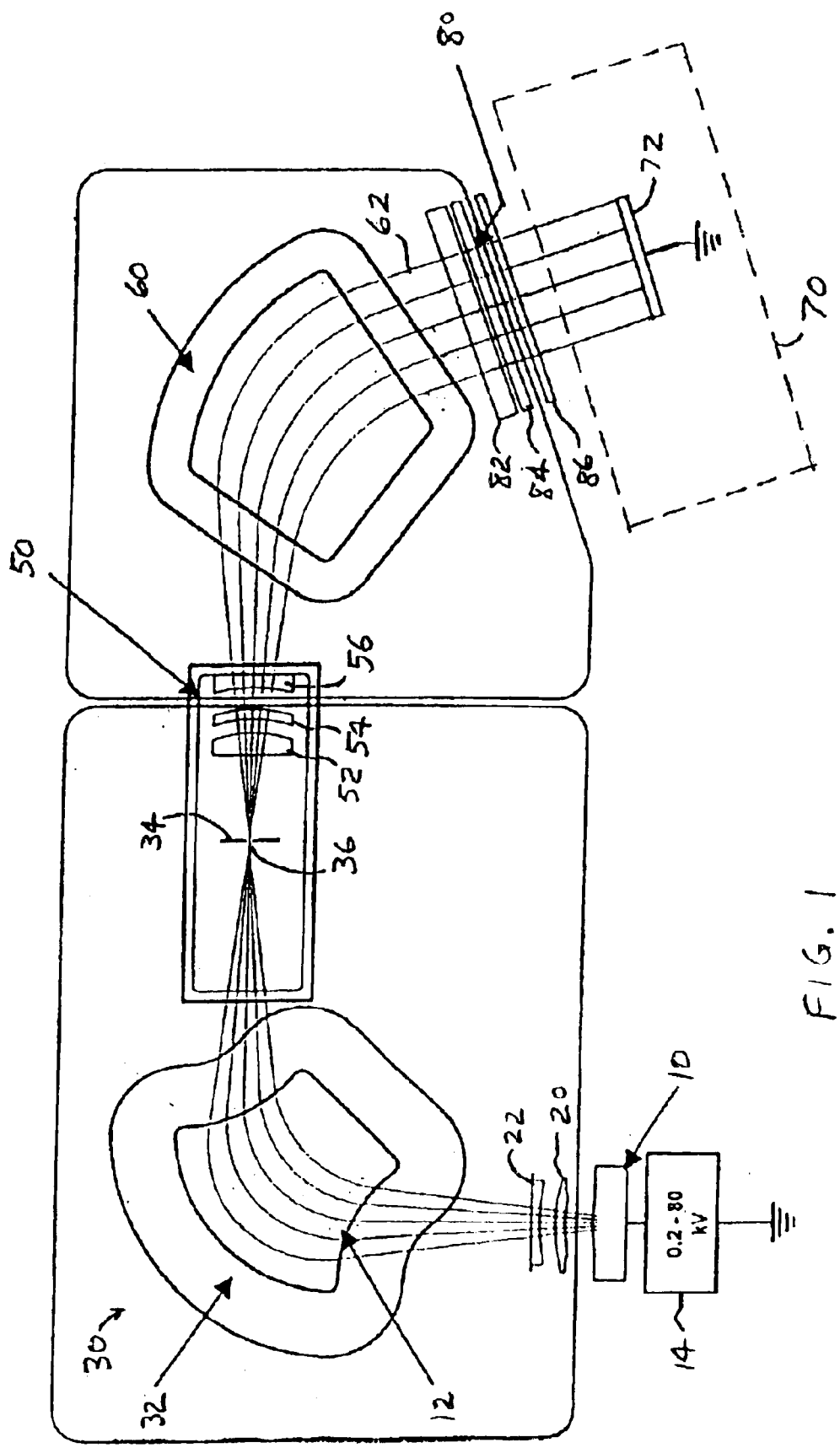
FIG. 1 is a simplified schematic diagram of an embodiment of an ion implanter.

A block diagram of an embodiment of an ion implanter is shown in FIG. 1. An ion source 10 generates ions and supplies an ion beam 12. Ion source 10 may include an ion chamber and a gas box containing a gas to be ionized. The gas is supplied to the ion chamber where it is ionized. The ions thus formed are extracted from the ion chamber to form ion beam 12. Ion beam 12 is directed between the poles of a resolving magnet 32. A first power supply 14 is connected to an extraction electrode of ion source 10 and provides a positive first voltage $V_0$. First voltage $V_0$ may be adjustable, for example, from about 0.2 to a 80 kV. Thus, ions from ion source 10 are accelerated to energies of about 0.2 to 80 KeV by the first voltage $V_0$.

Ion beam 12 passes through a suppression electrode 20 and a ground electrode 22 to a mass analyzer 30. The mass analyzer 30 includes resolving magnet 32 and a masking electrode 34 having a resolving aperture 36. Resolving magnet 32 deflects ions in ion beam 12 such that ions of a desired ion species pass through resolving aperture 36 and undesired ion species do not pass through resolving aperture 36 but are blocked by the masking electrode 34. In one embodiment, resolving magnet 32 deflects ions of the desired species by 90°.

Ions of the desired ion species pass through resolving aperture 36 to a first deceleration stage 50 positioned downstream of mass analyzer 30. Deceleration stage 50 may include an upstream electrode 52, a suppression electrode 54 and a downstream electrode 56. Ions in the ion beam are decelerated by deceleration stage 50 and then pass through an angle corrector magnet 60. Angle corrector magnet 60 deflects ions of the desired ion species and converts the ion beam from a diverging ion beam to a ribbon ion beam 62 having substantially parallel ion trajectories. In one embodiment, angle corrector magnet 60 deflects ions of the desired ion species by 70°.

An end station 70 supports one or more semiconductor wafers, such as wafer 72, in the path of ribbon ion beam 62 such that ions of the desired species are implanted into the semiconductor wafer. The end station 70 may include a cooled electrostatic platen and a scanner (not shown) for moving wafer 72 perpendicular to the long dimension of the ribbon ion beam 62 cross-section, so as to distribute ions over the surface of wafer 72. The ribbon ion beam may be at least as wide as wafer 72.

The ion implanter may include a second deceleration stage 80 positioned downstream of angle corrector magnet 60. Deceleration stage 80 may include an upstream electrode 82, a suppression electrode 84 and a downstream electrode 86.

The ion implanter may include additional components known to those skilled in the art. For example, end station 70 typically includes automated wafer handling equipment for introducing wafers into the ion implanter and for removing wafers after ion implantation. End station 70 may also include a dose measuring system, an electron flood gun and other known components. It will be understood that the entire path traversed by the ion beam is evacuated during ion implantation.

The ion implanter of FIG. 1 may operate in one of several modes. In a first operating mode, known as the drift mode, deceleration stages 50 and 80 are connected to ground, and the ion beam 12 is transported through the beamline at the final beam energy established after extraction from ion source 10. In a second operating mode, known as the enhanced drift mode, the ion beam 12 is accelerated to an intermediate energy at electrode 22 before passing through mass analyzer 30 and then is decelerated to the final beam energy by first deceleration stage 50. In a third operating mode, known as the double deceleration mode, the ion beam is accelerated to a first intermediate energy at electrode 22 before passing through mass analyzer 30, is decelerated by first deceleration stage 50 to a second intermediate energy as it passes through angle corrector 60 and then is decelerated to the final beam energy by second deceleration stage 80. A fourth operating mode transports the beam at the intermediate energy through to the second deceleration stage 80, and the gap at the first deceleration stage 50 is operated with a short circuit shunt. By transporting the ion beam through part of the beamline at higher energy, space charge expansion can be reduced in comparison with the drift mode for a given final beam energy.

As noted above, space charge expansion of low energy ion beams is problematic in magnets, because the gap between magnet polepieces is typically small and the beam path through the magnet is typically long. Thus, in the ion implanter of FIG. 1, ion beam 12 may undergo space charge expansion as it is transported through resolving magnet 32 and angle corrector magnet 60. Space charge expansion causes the ion beam to strike beamline components and results in reduced beam current delivered to the wafer.

Figure 2:
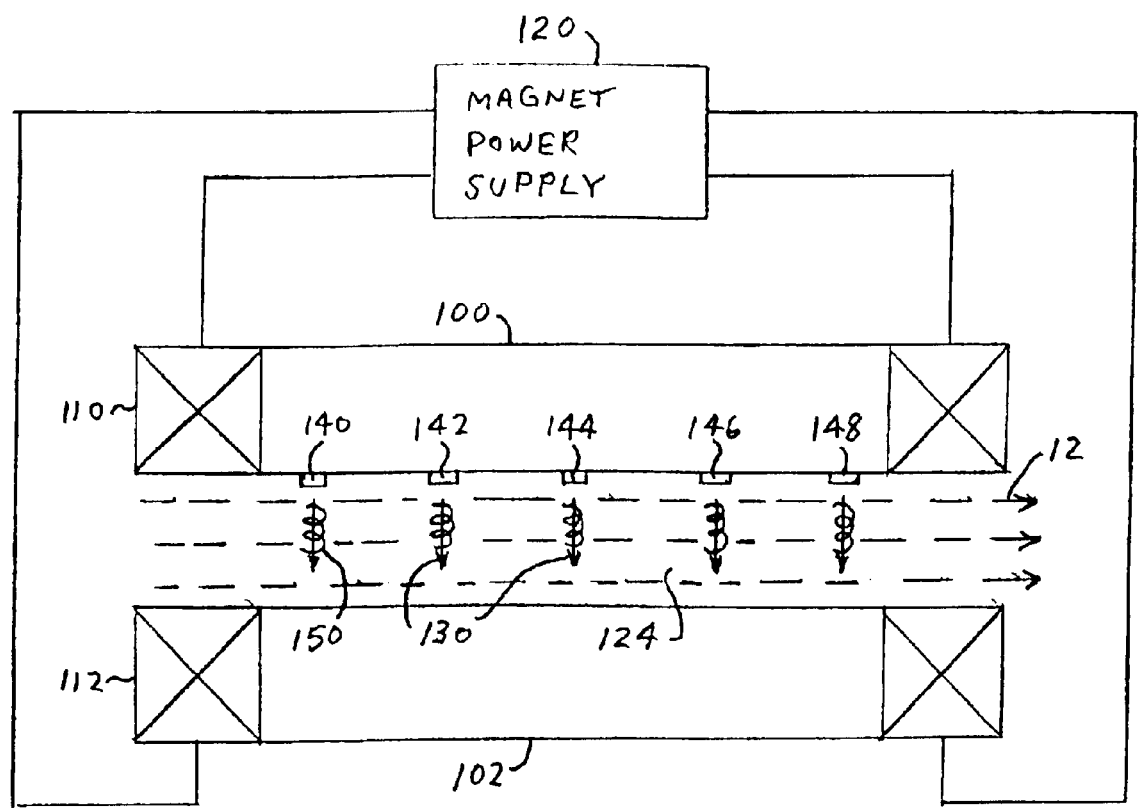
FIG. 2 is a simplified cross-sectional diagram of a magnet incorporating electron sources in accordance with a first embodiment of the invention.

A magnet assembly in accordance with a first embodiment of the invention is illustrated in FIG. 2. FIG. 2 is a side view of the magnet assembly. The magnet assembly may be incorporated into the ion implanter of FIG. 1 as either the resolving magnet 32 or the angle corrector magnet 60, or both, or into any other ion implanter which requires a magnet for deflecting ions. Basic components of the magnet assembly include a magnet and one or more electron sources. The magnet includes polepieces 100 and 102, magnet coils 110 and 112 disposed around polepieces 100 and 102, respectively, and a magnet power supply 120 coupled to magnet coils 110 and 112. Ion beam 12 is transported through a magnet gap 124 between polepieces 100 and 102. When magnet power supply 120 is energized, magnetic fields 130 are produced in magnet gap 124. The magnetic fields 130 are perpendicular to the direction of ion beam transport and deflect ion beam 12 as known in the art.

The magnet assembly further includes one or more electron sources disposed on or in proximity to at least one of polepieces 100 and 102 for producing low energy electrons in magnet gap 124. A purpose of the electron sources is to produce low energy electrons which neutralize the positive space charge of the ion beam 12, at least partially, and which thereby limit space charge expansion of ion beam 12. Because the low energy electrons are supplied to ion beam 12 in magnet gap 124, the ion beam space charge is neutralized as the beam is transported through magnet gap 124.

In the embodiment of FIG. 2, electron sources 140, 142, 144, 146 and 148 are disposed on polepiece 100. Each of the electron sources 140, 142, 144, 146 and 148 produces low energy electrons which are directed toward ion beam 12. The electrons follow spiral electron trajectories 150 because of the magnetic fields 130 in magnet gap 124. The electrons neutralize the space charge of ion beam 12 and limit space charge expansion of ion beam 12 in magnet gap 124. The effectiveness of ion beam space charge neutralization depends on the quantity and energy of electrons produced in relation to the quantity of positive ions in the ion beam.

The ion beam 12 includes positively charged ions and, without additional charged particles, produces a very positive electric potential in the space through which it is transported. This "space charge" causes the ions to be expelled from the regions where it is highest, i.e. the beam core. The presence of electrons in the region can help reduce the space charge potential. Some electrons are normally produced by collisions with the residual gas. Electron trajectories 150 are caused to spiral by magnetic fields 130 and are attracted to the positive potential of the ion beam. If the electrons lose enough energy by collisions with atoms in the residual gas, the electrons may be captured in the potential well of the beam, oscillating across the beam path until they are lost by atomic capture, well leakage or crossed magnetic and electric field (ExB) transport. The population of electrons in the potential well effectively neutralizes a portion of the space charge, and the ion beam is transported with less space charge expansion as a result. Ideally, it is desirable to achieve 100% compensation for the positive beam potential, but losses and low electron production makes this objective difficult to achieve.

The magnet assembly may include one or more electron sources. The electron sources may be mounted on, near, or recessed within, one or both of polepieces 100 and 102. The effectiveness of the electron sources in reducing space charge expansion of ion beam 12 is a function of the number of electron sources, the number and energy of the electrons produced by the electron sources, and the distribution of the electron sources relative to ion beam 12. In the case of a ribbon ion beam having a ribbon beam width, the electron sources may be distributed between the magnet polepieces across the ribbon beam width. Also, the electron sources may be distributed between the magnet polepieces along the direction of beam transport. The electron sources may be implemented as a one or two-dimensional array of individual electron emitters, one or more linear electron emitters, or an area electron emitter, for example. Any electron source of suitable size, shape and electron generating capability may be utilized. Examples of suitable electron sources are described below. Preferably, the electrons have energies of about 10 electron volts (eV) or less.

Figure 3:
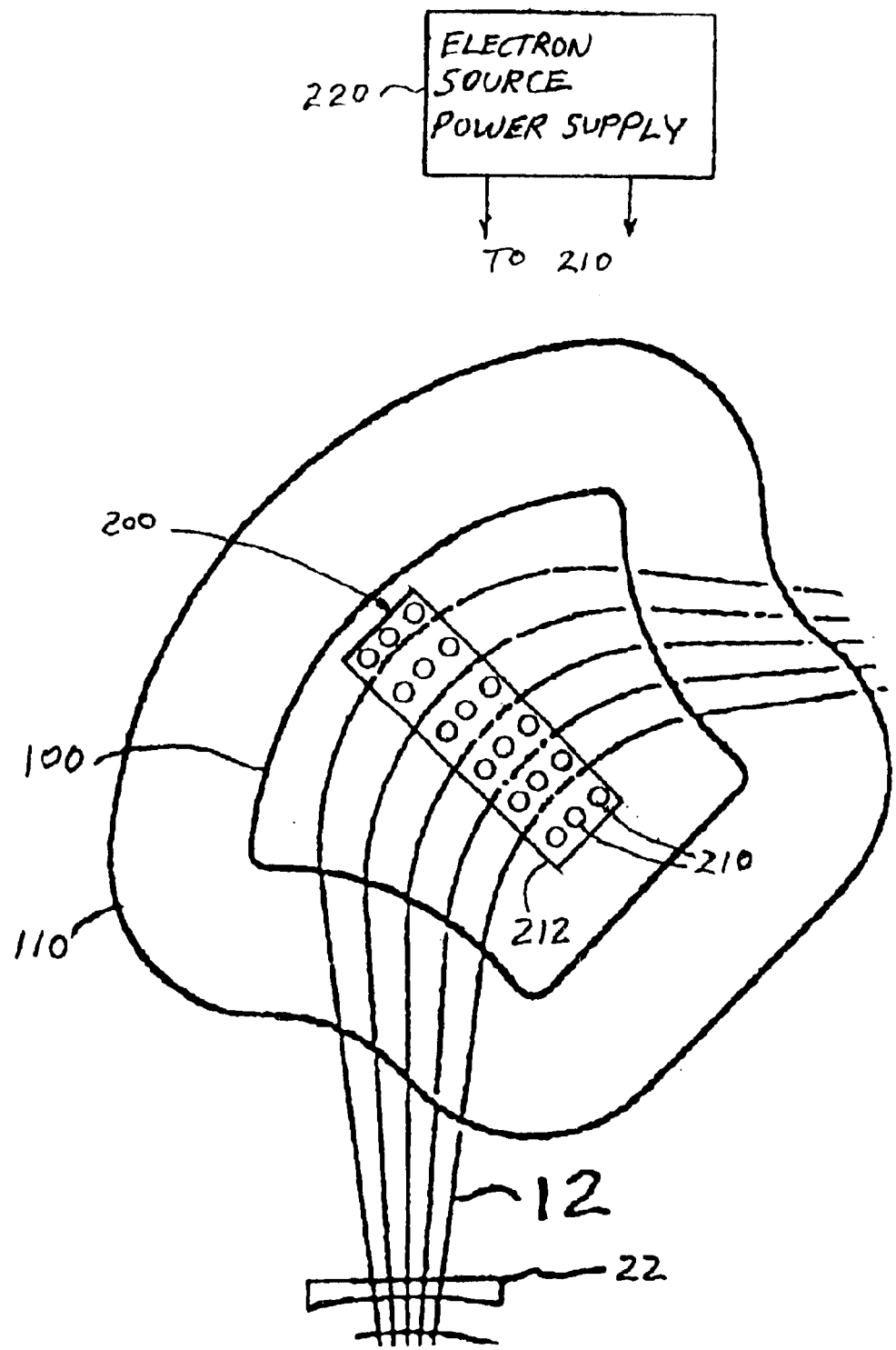
FIG. 3 is a top schematic view of a magnet incorporating a field emitter array for ion beam neutralization in accordance with a second embodiment of the invention.

A magnet assembly in accordance with a second embodiment of the invention is shown in FIG. 3. FIG. 3 is a top view of the magnet assembly. Like elements in FIGS. 2 and 3 have the same reference numerals. The magnet assembly of FIG. 3 may have the same magnet structure as the magnet assembly of FIG. 2.

In the embodiment of FIG. 3, the electron source includes a field emitter array 200 disposed on a surface of polepiece 100 facing magnet gap 124. The field emitter array 200 may include multiple field emitters 210 formed on a substrate 212. Techniques for fabricating field emitter arrays are described by D. Kim et al. in "Fabrication of Silicon Field Emitters by Forming Porous Silicon," *J. Vac. Sci. Tech.* B14(3), May/June 1996, pages 1906–1909 and by I. Kim et al. in "Fabrication of Metal Field Emitter Arrays on Polycrystalline Silicon," *J. Vac. Sci. Tech.* B15(2), March/April 1997, pages 468–471. A silicon field emitter array may provide reduced risk of contamination when a silicon semiconductor wafer is being implanted.

It will be understood that the field emitter array 200 may have any desired configuration. For example, the field emitters 210 may be arranged in a pattern of rows and columns. The field emitter array of FIG. 3 has three columns and six rows. A practical embodiment may include a larger number of rows and columns. In other embodiments, the field emitter array may utilize one or more linear arrays that are perpendicular to the trajectories of ion beam 12 as the beam is deflected by the magnet. Thus, for example, a plurality of linear field emitter arrays may diverge from a central point. The field emitter array 200 may cover all or a selected portion of the surface of polepiece 100 and/or polepiece 102. The spacing between field emitters in the array depends on the desired electron current to be delivered to ion beam 12. The field emitter array 200 may extend across the full width of ion beam 12 to ensure relatively uniform neutralization of ion beam 12. The field emitter array 200 is electrically connected to an electron source power supply 220. Power supply 220 provides to field emitter array 200 an appropriate voltage and current for emitting low energy electrons.

Figure 4:
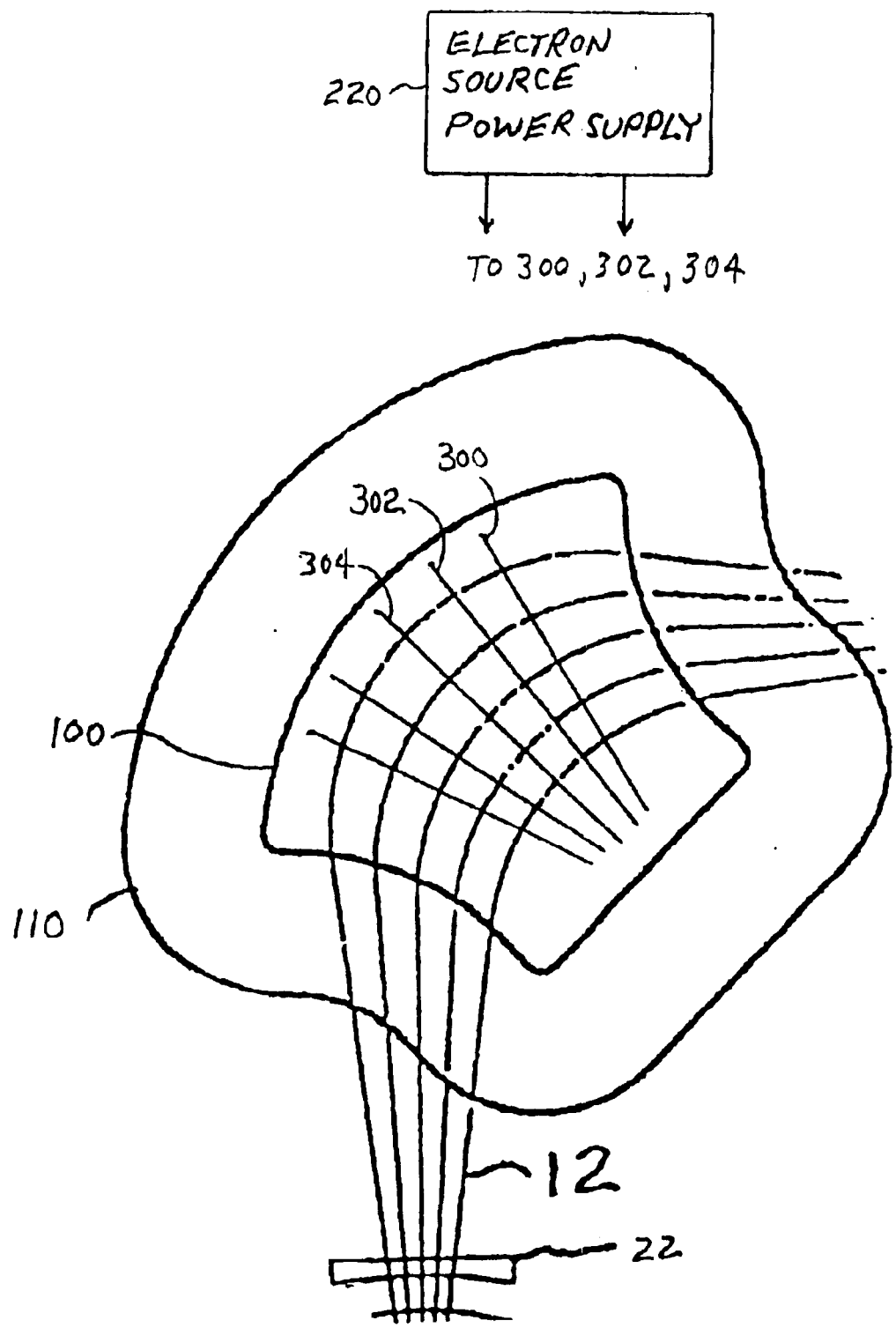
FIG. 4 is a top schematic view of a magnet incorporating electron-emitting wires in accordance with a third embodiment of the invention.

A magnet assembly in accordance with a third embodiment of the invention is shown in FIG. 4. FIG. 4 is a top view of the magnet assembly. Like elements in FIGS. 2–4 have the same reference numerals. The magnet assembly of FIG. 4 may have the same magnet structure as the magnet assembly of FIG. 2.

In the embodiment of FIG. 4, the electron source includes one or more electron-emitting wires 300, 302, 304, etc. The electron-emitting wires 300, 302, 304, etc. may be mounted on or near polepiece 100 and/or polepiece 102. The electron-emitting wires 300, 302, 304, etc. are connected to electron source power supply 220. Power supply 220 provides an appropriate voltage and current to heat electron-emitting wires 300, 302, 304, etc. to an electron emission temperature. Electron-emitting wires 300, 302, 304, etc. may be a refractory metal, such as tungsten or molybdenum. Electron-emitting wires 300, 302, 304 may be disposed perpendicular to or parallel to the ion trajectories of ion beam 12. In other embodiments, electron-emitting wires 300, 302, 304, etc. do not have a specified relation to the ion trajectories of ion beam 12.

Figure 5:
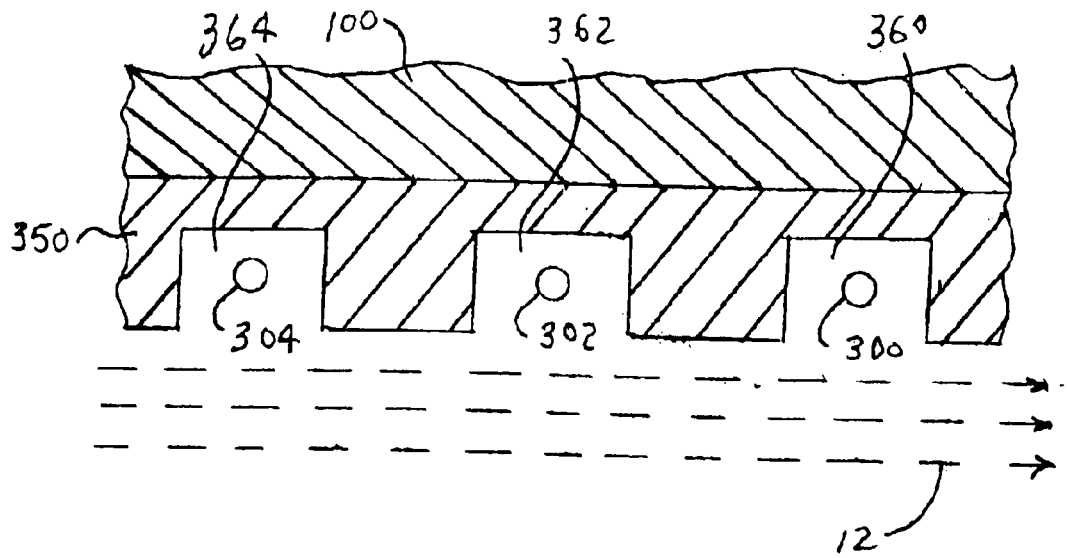
FIG. 5 is a partial cross-section view of the magnet of FIG. 4, showing a first configuration of electron-emitting wires recessed in a polepiece liner.

A first configuration for mounting electron-emitting wires 300, 302, 304, etc. is shown in FIG. 5. FIG. 5 is an enlarged partial cross-sectional view of polepiece 100. Polepiece liners, which may be fabricated of graphite, are typically utilized to prevent ion beam 12 from striking polepiece 100. As shown in FIG. 5, a polepiece liner 350 is provided with grooves 360, 362, 364 for receiving electron-emitting wires 300, 302, 304, respectively. Grooves 360, 362, 364 may have rectangular cross-sections and may have sufficient depth to prevent ion beam 12 from being incident on electron-emitting wires 300, 302, 304.

Figure 6:
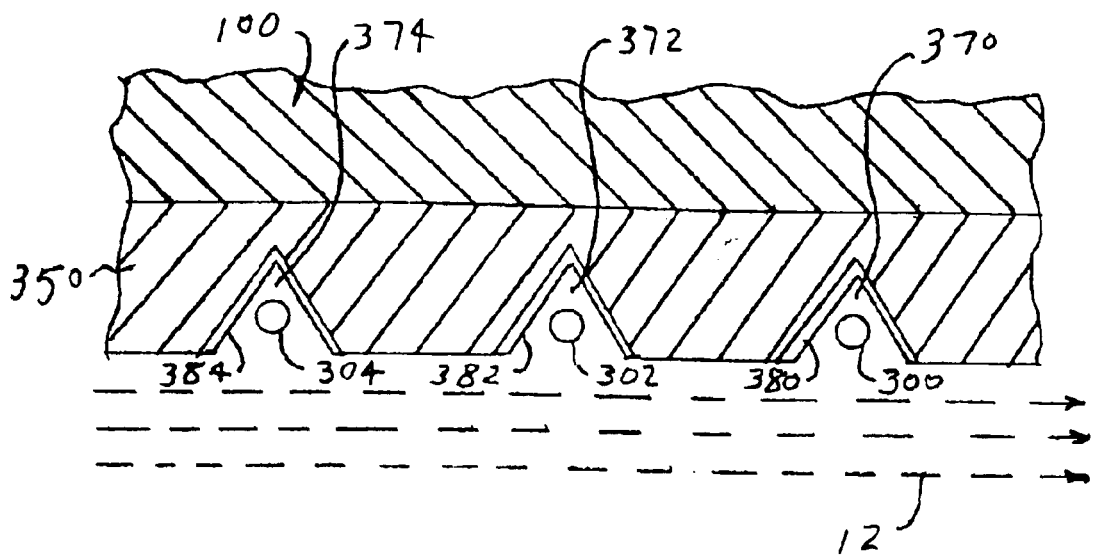
FIG. 6 is a partial cross-sectional view of the magnet of FIG. 4, showing a second configuration of electron-emitting wires recessed in a polepiece liner.

A second configuration for mounting electron-emitting wires 300, 302, 304, etc. is shown in FIG. 6. FIG. 6 is an enlarged cross-sectional view of polepiece 100. In the configuration of FIG. 6, polepiece liner 350 is provided with V-shaped grooves 370, 372, 374 for receiving electron-emitting wires 300, 302, 304, respectively. Insulators 380, 382, 384 may be disposed in grooves 370, 372, 374, respectively, behind the electron-emitting wires. The surfaces of the insulators 380, 382, 384 may build up electrical charge which reflects electrons emitted by electron-emitting wires 300, 302, 304 toward ion beam 12.

Figure 7:
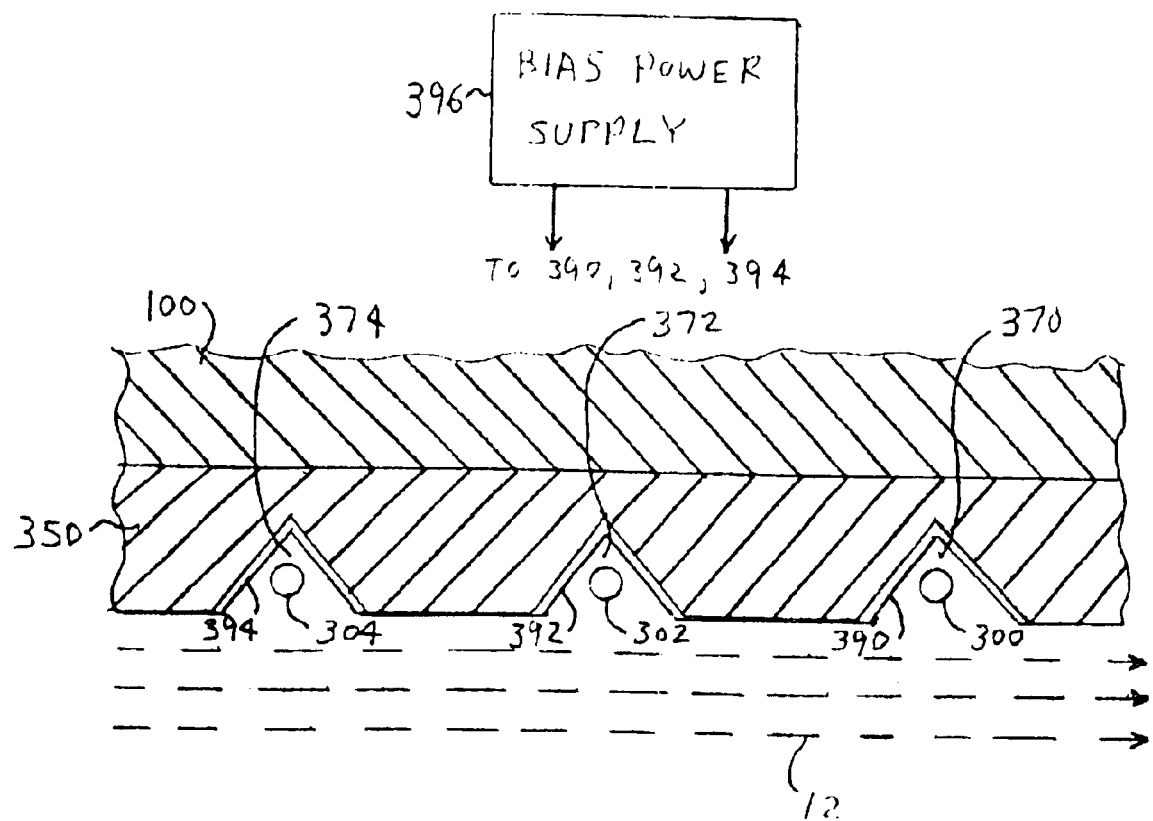
FIG. 7 is a partial cross-sectional view of the magnet of FIG. 4, showing a third configuration of electron-emitting wires recessed in a polepiece liner.

A third configuration for mounting electron-emitting wires 300, 302, 304, etc. is shown in FIG. 7. FIG. 7 is an enlarged cross-sectional view of polepiece 100. In the configuration of FIG. 7, polepiece liner 350 is provided with V-shaped grooves 370, 372, 374 for receiving electron-emitting wires 300, 302, 304, respectively. Electrically isolated conductors 390, 392, 394 are disposed in grooves 370, 372, 374, respectively, behind the electron-emitting wires. Conductors 390, 392, 394 are connected to a bias power supply 396. The conductors 390, 392, 394 are biased to reflect electrons emitted by electron-emitting wires 300, 302, 304 toward ion beam 12. Bias power supply 396 may be adjusted to control the efficiency of electron reflection.

Electron-emitting wires 300, 302, 304, etc. may have different configurations. In one configuration, straight wires are stretched across polepiece 100 and are affixed to appropriate mounting elements. In another configuration, wires 300, 302, 304, etc. are supported by insulating elements along their length. For example, wires 300, 302, 304, etc. may be wound around ceramic supports. A variety of electron-emitting wire configurations may be utilized within the scope of the invention. As shown in FIGS. 5 and 6, the electron-emitting wires may be recessed in a polepiece liner to avoid contact with ion beam 12. In another configuration, electron-emitting wires may be recessed into the polepiece itself.

The ion implanter shown in FIG. 1 and described above delivers a ribbon ion beam to the semiconductor wafer or other workpiece. Other known ion implanter configurations utilize a scanned ion beam. For example, the ion beam may be scanned in one direction, and the wafer may be mechanically translated in an orthogonal direction to distribute the ion beam over the wafer. The present invention may be utilized in ion implanters which employ a scanned ion beam. One or more electron sources may be located on or near one or both polepieces of a magnet, and the electron sources may be distributed across the scan width. Thus, the invention may be utilized with a stationary ion beam or a scanned ion beam.

The ion implanter shown in FIG. 1 and described above includes resolving magnet 32 and angle corrector magnet 60. One or both of the magnets may include an electron source disposed on or in proximity to at least one polepiece for producing low energy electrons as described above. Other ion implanter architectures may include one or more magnets. In such ion implanter architectures, one or more of the magnets may include an electron source disposed on or in proximity to at least one of the polepieces for producing low energy electrons as described above.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An ion implanter comprising:
   an ion source for generating an ion beam;
   at least one magnet disposed in the path of the ion beam for deflecting ions in the ion beam, said at least one magnet comprising first and second polepieces spaced apart to define a magnet gap through which the ion beam is transported;
   an electron source disposed on or in proximity to at least one of said polepieces for producing low energy electrons in the magnet gap; and
   a target site downstream of said at least one magnet for supporting a target for ion implantation, wherein the ion beam is delivered to said target site.

2. An ion implanter as defined in claim 1, wherein the target is a semiconductor wafer.

3. An ion implanter as defined in claim 1, wherein said at least one magnet comprises one magnet.

4. An ion implanter as defined in claim 1, wherein said at lest one magnet comprises a plurality of magnets.

5. An ion implanter as defined in claim 1, wherein the ion beam comprises a ribbon ion beam having a ribbon beam width and wherein said electron source produces low energy electrons across the ribbon beam width.

6. An ion implanter as defined in claim 1, wherein the ion beam is scanned so as to produce an effective scan width and wherein said electron source produces low energy electrons across the scan width.

7. An ion implanter as defined in claim 1, wherein said electron source comprises one or more linear electron sources disposed perpendicular to a direction of transport of the ion beam.

8. An ion implanter as defined in claim 1, wherein said electron source comprises a one-dimensional array of electron sources.

9. An ion implanter as defined in claim 1, wherein said electron source comprises a two-dimensional array of electron sources.

10. An ion implanter as defined in claim 1, wherein said electron source comprises an area electron source.

11. An ion implanter as defined in claim 1, wherein said electron source comprises an array of field emitters mounted to at least one of said polepieces and facing the magnet gap.

12. An ion implanter as defined in claim 1, wherein said electron source comprises one or more electron-emitting wires disposed in proximity to at least one of said polepieces and perpendicular to a direction of transport of the ion beam.

13. An ion implanter as defined in claim 12, wherein said magnet further comprises a polepiece liner and wherein said one or more electron-emitting wires are recessed in the polepiece liner.

14. An ion implanter as defined in claim 13, wherein said one or more electron-emitting wires comprise tungsten wires and wherein said polepiece liner comprises graphite.

15. An ion implanter as defined in claim 12, wherein said one or more electron-emitting wires are recessed in at least one of said polepieces.

16. An ion implanter as defined in claim 12, wherein said electron source further comprises an insulator disposed behind each of said one or more electron-emitting wires for reflecting electrons toward the ion beam.

17. An ion implanter as defined in claim 12, wherein said electron source further comprises an electrically isolated conductor disposed behind each of said one or more electron-emitting wires for reflecting electrons toward the ion beam.

18. An ion implanter as defined in claim 17, further comprising a bias power supply connected to said conductor for controlling the efficiency of electron reflection.

19. An ion implanter as defined in claim 1, wherein said electron source is mounted on at least one of said polepieces in the magnet gap.

20. An ion implanter as defined in claim 1, wherein said electron source is located between said first and second polepieces.

21. An ion implanter as defined in claim 1, wherein said electron source is recessed in at least one of said polepieces.

22. A method for transporting an ion beam through a magnet, comprising:

directing the ion beam through a magnet gap between first and second polepieces of the magnet; and supplying low energy electrons to the ion beam being transported through the magnet gap between the first and second polepieces of the magnet by an electron source disposed on or in proximity to at least one of the first and second polepieces.

23. A method as defined in claim 22, further comprising the step of transporting the ion beam from the magnet to a target at a target site.

24. A method as defined in claim 22, wherein the step of supplying low energy electrons comprises supplying electrons from one or more electron sources disposed perpendicular to a direction or transport of the ion beam.

25. A method as defined in claim 22, wherein the step of supplying low energy electrons comprises supplying electrons from one or more electron-emitting wires disposed in proximity to at least one of the polepieces.

26. A magnet assembly for operation with an ion beam, comprising:

a magnet disposed in the path of the ion beam, said magnet comprising first and second polepieces spaced apart to define a magnet gap through which the ion beam is transported; and one or more electron sources disposed on or in proximity to at least one of said polepieces for producing low energy electrons in the magnet gap.

* * * * *